US007475187B2

(12) United States Patent
Gregorius et al.

(10) Patent No.: US 7,475,187 B2
(45) Date of Patent: * Jan. 6, 2009

(54) HIGH-SPEED INTERFACE CIRCUIT FOR SEMICONDUCTOR MEMORY CHIPS AND MEMORY SYSTEM INCLUDING THE SAME

(75) Inventors: Peter Gregorius, München (DE); Hermann Ruckerbauer, Moos (DE); Paul Wallner, Prien (DE)

(73) Assignee: Infineon Technologies AG, Neubiberg (DE)

( * ) Notice: Subject to any disclaimer, the term of this patent is extended or adjusted under 35 U.S.C. 154(b) by 426 days.

This patent is subject to a terminal disclaimer.

(21) Appl. No.: 11/226,457

(22) Filed: Sep. 15, 2005

(65) Prior Publication Data

US 2007/0073942 A1 Mar. 29, 2007

(51) Int. Cl.
*G06F 15/17* (2006.01)
(52) U.S. Cl. .......................................... 711/104; 711/5
(58) Field of Classification Search ................ 711/5; 710/71, 100, 52; 365/189, 220, 230, 233, 365/343; 375/214
See application file for complete search history.

(56) References Cited

U.S. PATENT DOCUMENTS

| | | | | |
|---|---|---|---|---|
| 5,233,603 | A * | 8/1993 | Takeuchi et al. | 370/412 |
| 6,081,557 | A * | 6/2000 | Suemura et al. | 375/259 |
| 6,084,823 | A * | 7/2000 | Suzuki et al. | 365/233 |
| 6,215,727 | B1 * | 4/2001 | Parson et al. | 365/233 |
| 6,801,518 | B2 * | 10/2004 | Mullaney et al. | 370/343 |
| 6,889,304 | B2 * | 5/2005 | Perego et al. | 711/170 |
| 7,054,215 | B2 * | 5/2006 | Kwon et al. | 365/220 |
| 7,058,120 | B1 * | 6/2006 | Lu et al. | 375/214 |
| 7,184,360 | B2 * | 2/2007 | Gregorius et al. | 365/233 |
| 7,266,634 | B2 * | 9/2007 | Ware et al. | 711/105 |
| 7,356,639 | B2 * | 4/2008 | Perego et al. | 711/105 |
| 2006/0107186 | A1 * | 5/2006 | Cowell et al. | 714/776 |
| 2006/0218451 | A1 * | 9/2006 | Abe | 714/52 |
| 2007/0073942 | A1 * | 3/2007 | Gregorius et al. | 710/71 |
| 2007/0121389 | A1 * | 5/2007 | Wu et al. | 365/189.05 |

OTHER PUBLICATIONS http://www.rambus.com/us/patents/innovations/detail/flyby.html.*

* cited by examiner

*Primary Examiner*—Henry Tsai
*Assistant Examiner*—Cheng-Yuan Tseng
(74) *Attorney, Agent, or Firm*—Edell, Shapiro & Finnan, LLC (57) ABSTRACT

In a semiconductor memory system, the memory chips are linked to a memory module in a shared loop forward architecture and connected in a point-to-point connection to a memory controller. Each memory chip includes a high-speed interface circuit including: a read and write data/command-and-address signal re-driver/transmitter path for re-driving serial read data and write data/command-and-address signals not destined for the semiconductor memory chip; and a main signal path which includes a serial-to-parallel converter and a synchronizer for serial-to-parallel converting and synchronizing with a reference clock signal write data/command-and-address signals destined for the semiconductor memory chip as well as a parallel-to-serial converter for parallel-to-serial converting read data signals read from a memory core of the memory chips, and a switch for inserting the parallel-to-serial converted read data signals into the re-driver/transmitter path. Optionally the high-speed interface circuit additionally includes a transparent re-driver/transmitter path not including any synchronizing circuitry.

27 Claims, 4 Drawing Sheets

HIGH-SPEED INTERFACE CIRCUIT FOR SEMICONDUCTOR MEMORY CHIPS AND MEMORY SYSTEM INCLUDING THE SAME

FIELD OF THE INVENTION

The present invention relates to a high-speed interface circuit, a semiconductor memory chip including the same, and to a memory system including such semiconductor memory chips.

BACKGROUND

Recent developments in fast semiconductor memories will lead to high-speed signal transmission rates of, for example, up to 7 Gbit/s. These high signal transmission rates require careful design considerations with respect to the implementation of an appropriate topology and a suitable design of interface circuits between the exterior of the chip and the chips internal circuitry.

Future generations of memory systems will likely arrange the memory chips in a chain which aims to increase the attainable storage density. For this chaining of the memory chips, serial high-speed interface circuits are required to include a repeater/re-driver function for data signals as well as command and address signals.

One advantageous topology of arranging the memory chips in such a chain is a shared loop forward architecture in which the write data signals and command and address signals and the read data signals to/from the memory chips share a common read/write bus, wherein the read and write data signals and command and address signals are propagated on a memory module in one and the same direction (unidirectional) through a shared loop forward bus.

Figure 1:
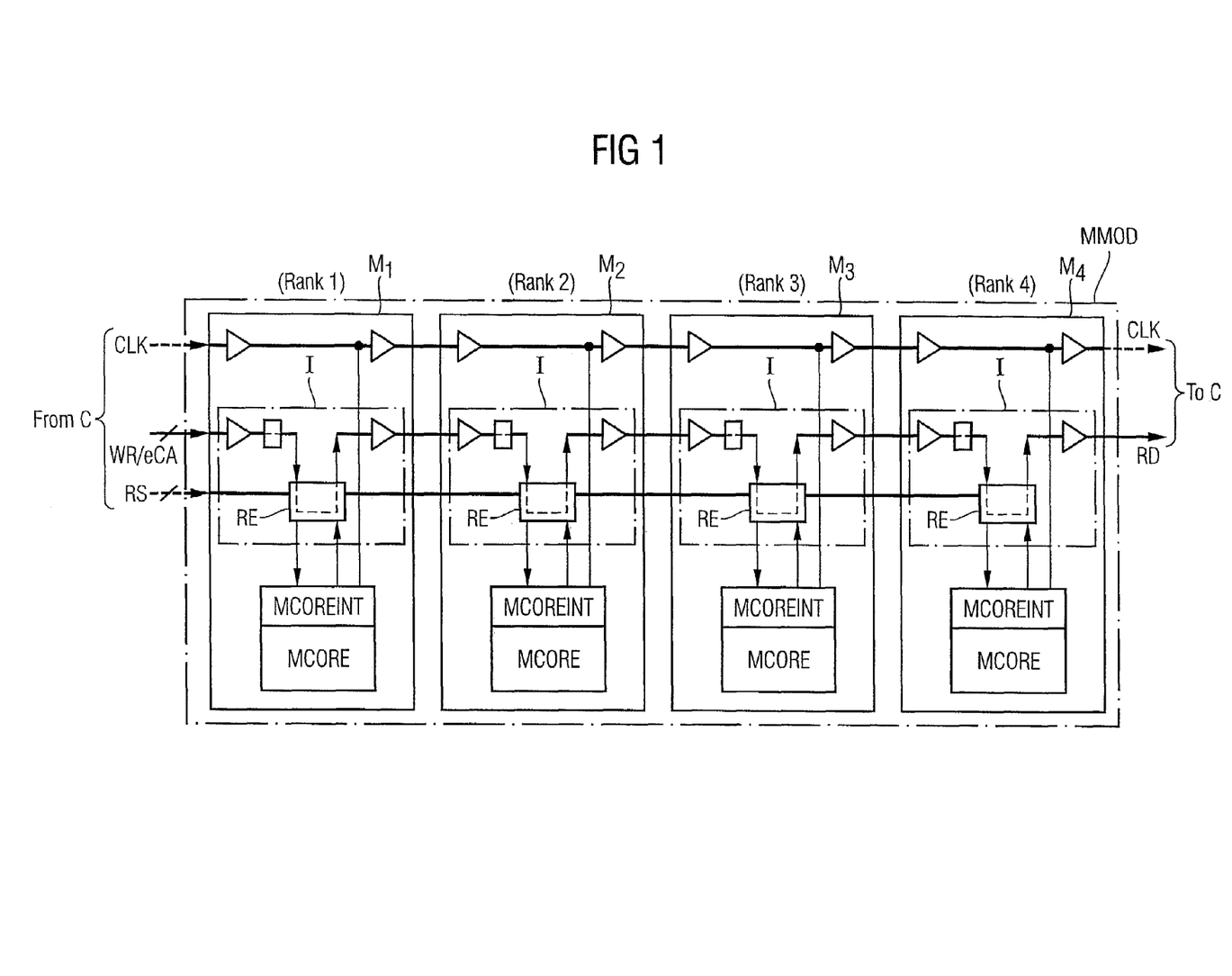
FIG. 1 schematically shows a first example of a shared loop forward arrangement of four memory chips on a memory module and their interconnection by a shared bus system, wherein a rank signal is separately transferred from a memory controller to the memory module.

FIG. 1 schematically shows an arrangement of four memory chips M1, M2, M3, M4, arranged and connected in the shared loop forward architecture on a memory module MMOD and to a memory controller C, each memory chip M1 to M4 having a dedicated rank Rank 1 to Rank 4 (or chip number) in a memory system. In the example of FIG. 1, a serial stream of write data signals and command and address signals WR/eCA is driven through the common shared loop forward bus from the memory controller C (not shown) to the first memory chip M1 on the memory module MMOD. Write data signals and command and address signals may be destined for the first memory chip M1 or for another one of the memory chips M2-M4 on the memory module MMOD. Therefore each memory chip M1-M4 has a repeater (or re-drive) function RE. This repeater or re-drive function is also required for re-driving read data through one or more memory chip on the memory module MMOD to the memory controller C. FIG. 1 further shows that each memory chip M1 to M4 on the memory module MMOD receives and drives a clock signal CLK and a separate rank select signal RS generated by the memory controller C and is supplied from the memory controller C separately, i.e., not within the write data/command and address signal stream WR/eCA. As shown, the clock signal CLK may be driven from the last memory chip M4 in the chain to the memory controller C (or optionally to another same memory module).

To implement certain interface processes and the re-drive function RE, each memory chip M1-M4 includes a high-speed interface circuit I. Each memory chip M1-M4 further includes a memory core MCORE and a memory core interface MCOREINT associated to the memory core MCORE.

Figure 2:
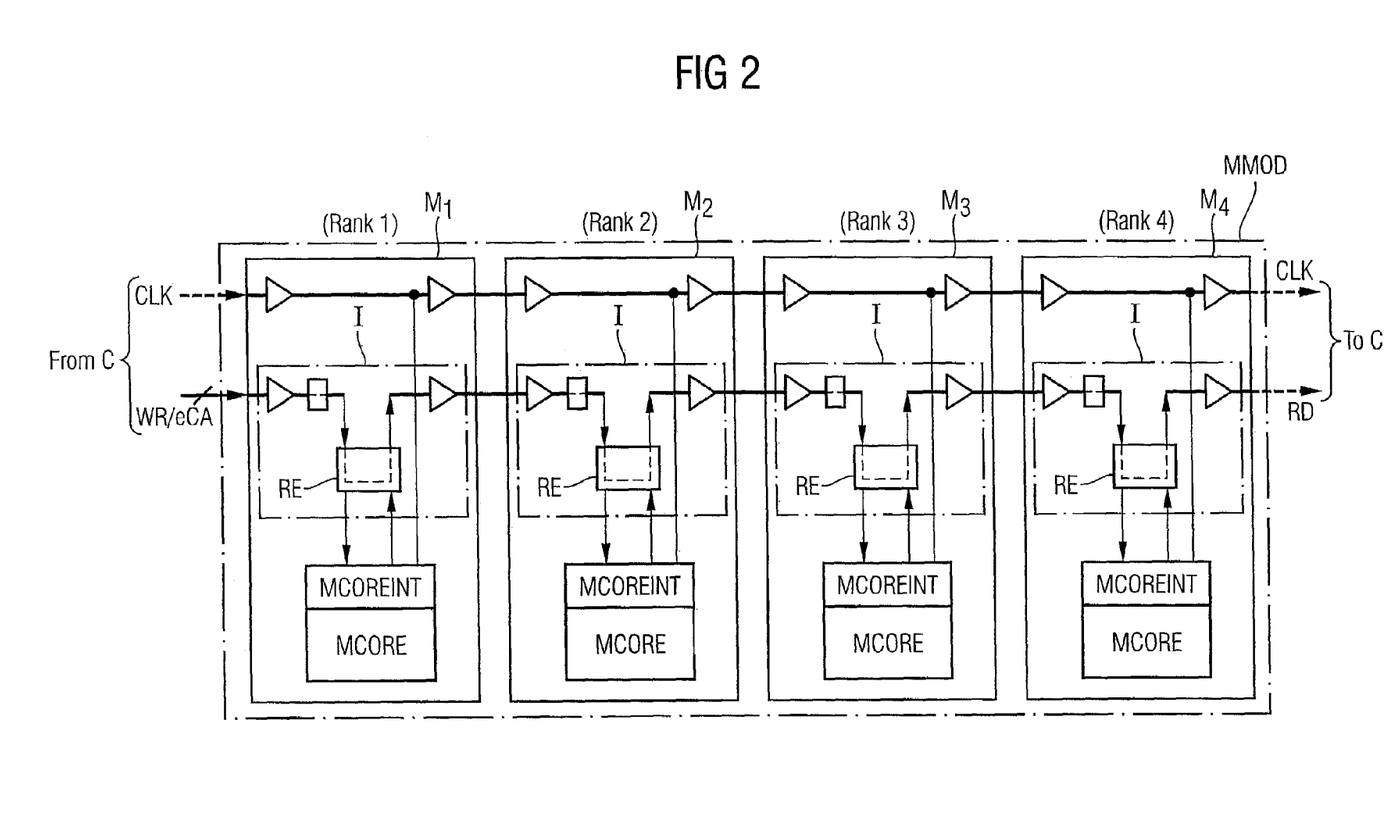
FIG. 2 schematically shows a second example of a shared loop forward arrangement of four memory chips on a memory module wherein a rank select signal is included in a write data/command and address signal stream from the memory controller.

FIG. 2 schematically shows an alternative example of an arrangement of four memory chips M1-M4 on a memory module MMOD in a chain having a shared loop forward architecture, wherein the arrangement of FIG. 2 differs from that of FIG. 1 only in that the rank select signal RS is not separately transferred from the memory controller C but included in the signal stream WR/eCA transmitted from the memory controller C. That is, the function of whether the high-speed interface circuit I of each memory chip M1-M4 exhibits the re-driver/repeater function RE or if the write data/command and address signals WR/eCA are alternatively to be processed within the memory chip is controlled by the rank signal RS included in the data/command and address signal stream.

Notably, in case the where data transfer between the memory controller C and the memory module MMOD and between the memory chips M1-M4 on the memory module MMOD is ruled by a protocol, and the data and command signals are organized in signal frames in accordance with the protocol, the memory core interface MCOREINT of each memory chip M1-M4 is required to include certain alignment procedures, a demultiplexing function, and a frame decoding function. The present invention, however, focuses on the functions and circuit construction of the high-speed interface circuit I rather than the functions and the circuit construction of the memory core interface MCOREINT.

For a system design of a memory module MMOD as it is shown in FIGS. 1 and 2, there are following objectives: same propagation direction on the memory module; same propagation delay for each memory chip (rank); same latency for each memory chip (rank); no functional cause of collision of write data signals or command and address signals as well as read data on the shared bus; and the timing calibration at the memory controller C should be simple.

SUMMARY

In view of the above, the present invention provides a high-speed interface circuit having a repeater/re-drive function which can be implemented in semiconductor memory chips arranged in a shared loop forward architecture as it is explained above in view of FIGS. 1 and 2. The present invention also provides a semiconductor memory chip including such a high-speed interface circuit as well as a semiconductor memory system that includes a plurality of such semiconductor memory chips arranged on a memory module and linked in the form of a shared loop forward architecture.

According to a first aspect of the invention, a high-speed interface circuit is implemented in a semiconductor memory chip having a memory core, the high-speed interface circuit being connectable to a shared read and write data/command and address bus. The interface circuit includes: a serial output terminal connectable to a serial input terminal of an interface circuit of a next memory chip or to a serial input terminal of the memory controller; and a serial input terminal for receiving a serial stream of data/command and address signals from a serial output terminal of a corresponding interface circuit section of a preceding same memory chip or from a serial output terminal of a memory controller; a read and write data/command and address signal re-driver/transmitter path arranged for re-driving read data signals and write data/command and address signals not destined to the present semiconductor memory chip and received at the serial input terminal; and a main signal path leading from a parallel read data input terminal to the serial output terminal for transmitting read data from the memory core and from the serial input terminal to a parallel write data/command and address signal output terminal to transfer parallel write data/command and address signals to the memory core. The main signal path includes: synchronization means for synchronizing with a reference clock signal data/command and address signals received at the serial input terminal; serial-to-parallel converting means for serial-to-parallel converting write data/command and address signals destined for the present memory chip; first clock domain conversion and signal buffering means for buffering and converting the clock domain of the synchronized and serial-to-parallel converted write data/command and address signals destined for the present memory chip to the clock domain of the memory core before delivering them to the parallel output terminal and from there to the memory core; second clock domain conversion and signal buffering means for buffering the parallel read data signals received from the memory core at the parallel read data input terminal and converting the clock domain thereof from the clock domain of the memory core to the clock domain of the reference clock signal; parallel-to-serial conversion means for parallel-to-serial converting the buffered and clock domain converted parallel read data signals into a serial read data signal stream; and first insertion means for inserting the parallel-to-serial converted read data signal stream into the serial data stream of the read and write data/command and address signal re-driver/transmitter path and for transferring it to the serial output terminal. The high-speed interface circuit further includes a reference clock receiving terminal for receiving the reference clock signal.

The present high-speed interface circuit may principally be operated by a full-speed clock, a half rate clock, a third rate clock or a quarter rate clock. The latter expressions "full-speed", "half rate", "third rate" and "quarter rate" refer to a clock rate of a reference clock in relation to a basic system clock. Preferably, the present high-speed interface circuit includes in its read and write data/command and address signal re-driver/transmitter path synchronized signal re-driving/transmitting and synchronization means for synchronizing the re-driven read and write data/command and address signals with the reference clock signal. Optionally, the present high-speed interface circuit includes as the read and write data/command and address signal re-driver/transmitter path a transparent signal re-driver/transmitter path not including clock signal synchronizing circuitry. Further, the synchronized signal re-driving/transmitting and synchronization means can be formed by the synchronization means of the main signal path. The high-speed interface circuit can include second insertion means arranged before the serial output terminal and controlled by an external signal from the memory controller for selectively switching between the signals re-driven through the transparent re-driver/transmitter path and the signals driven through the main signal path.

According to an exemplary implementation, the high-speed interface circuit further includes: a bit synchronization unit arranged after the serial input terminal as the signal synchronization means for sampling and bit-synchronizing the serial stream of data/command and address signals according to the reference clock; an even/odd bit alignment unit serially connected after the bit synchronization unit and arranged for buffering the serial data/command and address signals synchronized and sampled by the bit synchronization unit and aligning the sampled even and odd signals synchronously with the reference clock; wherein the serial-to-parallel converting means formed by a serial-to-parallel converter unit are connected after the even/odd bit alignment unit and adapted for converting the synchronized write data/command and address signals buffered and aligned by the even/odd bit alignment unit into the parallel write data/command and address signals; and the first clock domain conversion and signal buffering means formed by a write data-/command and address signal delivery FIFO unit are connected after the serial-to-parallel converter unit at the parallel output terminal and adapted for delivering the parallel write data stream to the memory core synchronously to an internal clock rate of the memory core and compensating for different data skews and drifts. The bit synchronization unit, the even/odd alignment unit and the serial-to-parallel converter unit can be respectively arranged for supplying the reference clock signal to the respectively next of the units in the data signal stream together with the supplied data/command and address signals. The main signal path can further include: a drift compensation FIFO-unit serially connected after the even/odd bit alignment unit and arranged for compensating phase drift of the even/odd bit aligned serial data/command and address signals in synchronism with the reference clock signal; and a 2:1 serializer serially arranged after the first insertion means and the drift compensation FIFO-unit. A data input of the serial-to-parallel converter unit is connected to an output of the preferred compensation FIFO-unit.

The high-speed interface circuit can advantageously include: a de-emphasize FIR-unit serially connected before the 2:1-serializer and after the drift compensation FIFO and arranged for channel adaptation to compensate for inter-symbol interference. The drift compensation FIFO-unit has a depth according to plural symbol sequences of the serial data/command and address signals. Preferably, the de-emphasis FIR-unit can be switched off by an external signal from the memory controller.

According to another implementation of the high-speed interface circuit, the first and second clock domain conversion and signal buffering means are respectively formed by: a write data/command and address signal delivery FIFO-unit connected to the parallel output terminal before the serial-to-parallel conversion means and adapted for delivering the parallel write data stream to the memory core synchronized to an internal clock rate of the latter and compensating for different data skews and drifts; and a read data signal delivery FIFO-unit connected to the parallel input terminal before the parallel-to-serial conversion means, wherein write data write and read-out operations in/from the write data/command and address signal delivery FIFO-unit are synchronized by the reference clock signal and the clock signal of the memory core, respectively, and read data write and read-out operations in/from the read data signal delivery FIFO-unit are synchronized by the clock signal of the memory core and by the reference clock, respectively.

Alternatively, the first and second clock domain conversion and signal buffering means are formed by a shared read and write data signal delivery FIFO-unit arranged at the parallel read data input terminal and the parallel write data/command and address signal output terminal from/to the memory core, wherein write data write and read-out operations in/from the shared read and data signal delivery FIFO-unit are synchronized by the reference clock signal and the clock signal of the memory core, respectively, and read data write/and read operations to/from the shared read and write data signal delivery FIFO-unit are synchronized by the clock signal of the memory core and by the reference clock, respectively, and wherein a mode switch is arranged after the shared read and write data signal delivery FIFO-unit for switching over the serial-to-parallel converted write data/command and address signals from the serial-to-parallel conversion means and the reference clock signal therefrom for the write operation into the shared read and write data signal delivery FIFO-unit and the read data signals read by a read operation from the shared read and write data signal delivery FIFO-unit in synchronism with the reference clock to the parallel-to-serial conversion means.

According to a second aspect of the present invention, a semiconductor memory chip includes a memory core and the high-speed interface circuit comprising the features as previously described. In this semiconductor memory chip, the memory core can be a dynamic RAM-memory core.

According to a third aspect of the present invention, a semiconductor memory system includes a plurality of such semiconductor memory chips as previously described, arranged on a memory module and connected in form of a shared loop forward architecture, wherein each memory chip has a different memory rank and connected by means of a common read data/write data/command and address bus in a point-to-point fashion to a memory controller.

The above and still further features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

The accompanying drawings, which are incorporated in and constitute a part of the specification illustrate presently preferred embodiments of the invention and together with a general description in the above disclosure and the detailed description given below serve to explain the principles of the invention.

DETAILED DESCRIPTION

Figure 3:
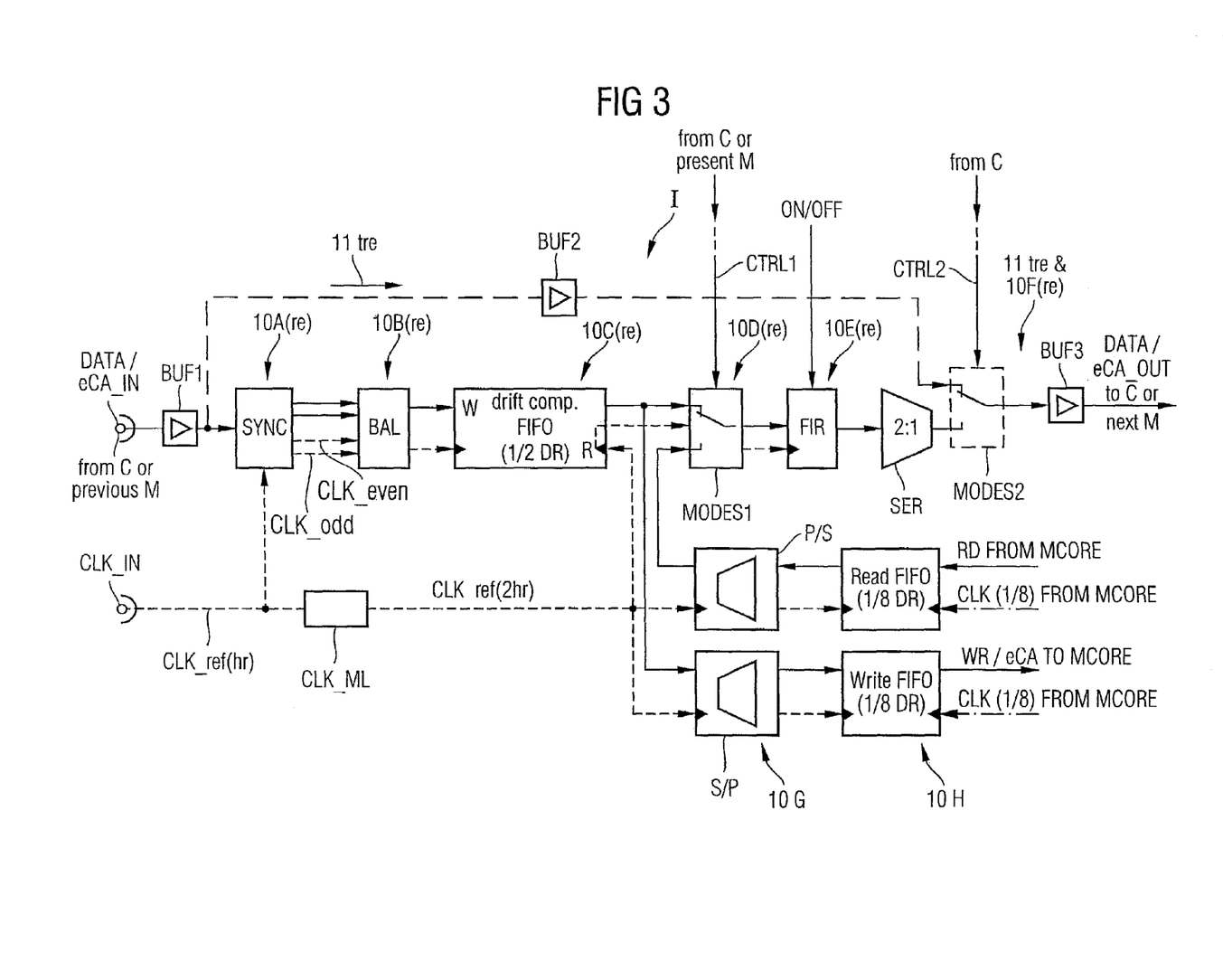
FIG. 3 schematically shows a functional block diagram of a first embodiment of a high-speed interface circuit adapted for receiving and transmitting a read and write data/command and address signal stream and including a transparent re-driving/transmitting path.

According to FIG. 3 which schematically depicts a first embodiment of the present high-speed interface circuit I, a main signal path 10 and a data/command-and-address signal re-driver/transmitter path are both formed between a serial input terminal DATA/eCA_IN and a serial output terminal DATA/eCA_OUT to be connected to a shared loop forward read and write data/command-and-address bus (cf., FIGS. 1 and 2). Further, the main signal path 10 is connected to a parallel read data input terminal RD from a memory core MCORE (not shown) and to a parallel write data/command-and-address signal terminal WR/eCA to the memory core MCORE.

As shown by broken lines, the high-speed interface circuit I may comprise an optional transparent signal re-driver/transmitter path 11tre which includes only a buffer circuit BUF2 and no clock signal synchronizing circuitry.

Write data signals addressed to the present memory core MCORE and command and address signals for the present memory chip are transferred from the serial input terminal DATA/eCA_IN through sections 10A, 10B, 10C, 10G, and 10H of the main signal path 10 to the memory core MCORE.

Read and write data signals as well as command and address signals received at the serial input terminal DATA/eCA_IN and not addressed to the present memory core MCORE but to be re-driven either to the memory controller C or to a next same memory chip via the serial output terminal DATA/eCA_OUT are according to a normal function transmitted through a synchronized read and write data/command-and-address signal re-driver/transmitter path comprising the sections 10A, 10B, 10C, 10D, 10E, and 10F of the main signal path 10 which therefore are designated by 10A(re)-10F(re) (re=re-driver). Optionally, the read and write data signals and the command and address signals not destined to the present memory core are re-driven according to a special function through the transparent signal re-driver/transmitter path 11tre which includes only the buffer circuit BUF2 and second insertion means implemented via mode switch MODES2 which is arranged before the serial output terminal DATA/eCA_OUT in the last section 10F(re). The mode switch MODES2 is controlled by an external mode switching signal CTRL2 from the memory controller for selectively switching between the signals re-driven through the transparent re-driver/transmitter path 11tre and the signals transmitted through the synchronized signal re-driving transmitter path. The read signals read from the memory core and input at the parallel read data input terminal RD are driven through the sections 10H, 10G, 10C, 10D, 10E and 10F of the main signal path to the serial output terminal DATA/eCA_OUT.

The high-speed interface circuit I further includes a reference clock receiving terminal CLK_IN for receiving a reference clock signal CLK_ref(hr) which, in the present embodiment is a half rate signal. That is, the clock rate of the reference clock signal CLK_ref is one half of the frequency of a system clock (not shown). Clock signal lines depicted in dotted lines distribute the reference clock and a clock signal CLK_ref (2 hr) which has the doubled frequency and is derived therefrom and phase-related thereto to the components of the main signal path 10 described below.

After a first buffer circuit BUF1, the signal path from the serial input terminal DATA/eCA_IN branches to the main signal path 10 and to the transparent read and write data-/command and address re-driver/transmitter path 11tre.

The sections 10A, 10B, 10C, 10D, 10E and 10F of the main signal path are now described. Section 10A includes a bit synchronization unit SYNC having the function of sampling and bit-synchronizing the serial data/command-and-address signal stream in accordance with the reference clock CLK_ref (hr) received at the clock receiving terminal CLK_IN.

An even bit read/write data/command-and-address signal stream and an odd bit read/write data/command-and-address signal stream are respectively fed from the bit synchronization unit SYNC to inputs of section 10B, which comprises an even/odd bit alignment unit BAL serially connected after the bit synchronization unit SYNC. Together with the even and odd bit read/write data/command-and-address signal streams, the bit synchronization unit SYNC feeds an even clock signal CLK_even and an odd clock signal CLK_odd to the bit alignment unit BAL for aligning the sampled even and odd parts of the read/write data/command-and-address signal stream with the even clock signal CLK_even and the odd clock signal CLK_odd, respectively.

Section 10C is serially connected after the bit alignment unit BAL in the main signal path 10 and includes a drift compensation FIFO arranged for compensating for certain data drifts and skews. The drift compensation FIFO has a length that corresponds to plural symbol sequences of the serial data/command-and-address signals.

The main signal path 10 includes in its write signal branch a serial-to-parallel converter S/P (Section 10G) adapted for converting the serial write data/command-and-address signals bit-aligned by BAL and drift-compensated by the drift compensation FIFO into a parallel data stream of write data/command-and-address signals. Further, the read signal branch includes as part of Section 10G a parallel-to-serial converter P/S for converting the parallel read data read from the memory core MCORE into a serial read data stream Section 10H includes a write FIFO as the final stage of the write signal branch of the main signal path 10, downstream of the serial-to-parallel converter S/P. The write FIFO is connected at its signal output to the parallel output terminal WR/eCA for delivering parallel write data/command-and-address signals to the memory core MCORE. Further, section 10H includes in the read signal branch a read FIFO connected at its input to the parallel read data input terminal and at its output to the parallel-to-serial converter P/S in section 10G.

The write FIFO has the function of a clock domain conversion and signal buffering means for buffering the synchronized and parallelized write data-/command and address signals and converting the clock domain of the latter to the clock domain CLK(⅛) of the memory core MCORE. The read FIFO also functions as a clock domain converter and signal buffer for buffering the parallel read data signals read from the memory core and converting the clock domain thereof to the clock domain of the reference clock signal CLK_ref.

The main signal path further includes Section 10D which comprises a first insertion means implemented by a mode switch MODES1 and arranged for inserting the read data signal stream parallel-to-serial converted by P/S into the serial data stream re-driven through the synchronized signal re-driven/transmitting path, that is through SYNC, BAL and the drift compensation FIFO of the sections 10A(re), 10B(re) and 10C(re). The mode switch MODES1 is controlled by a control signal CTRL1 which can either be an external signal delivered from the memory controller C or an internal signal generated by the present memory chip. In fact, the mode switch MODES1 is controlled by the rank select signal RS either transmitted from the memory controller C (FIG. 1) or embedded in the write data/command-and-address signal stream and evaluated and generated by the present memory chip (FIG. 2).

The main signal path 10 further includes Section 10E which comprises a de-emphasis FIR-filter (FIR=Finite Impulse Response) adapted for matching the signals to the channel characteristic. The FIR-filter FIR is based on the concept: "invert and delay." The filter weight is produced in the driver.

Section 10F is serially connected to the FIR-filter FIR and includes a 2:1 serializer SER, before the read/write data/command-and-address signals are buffered by a further buffer BUF3 and output through the serial data/command-and-address signal output terminal to the memory controller C or to the next memory chip.

For the optional version which includes the transparent signal re-driver/transmitter path 11tre, the section 10F(re) further includes second insertion means, that is a second mode switch MODES2 which is controlled by an external control signal CTRL2.

Notably, the FIR-filter FIR can be enabled/disabled by an external on/off signal. Further the clock signal path from the reference clock receiving terminal CLK_IN (depicted in dotted lines) includes a clock buffer/multiplier CLK_ML for buffering the clock signal CLK_ref(hr) and multiplying the latter by a factor of 2. The bit synchronizing unit SYNC transfers the even and odd clock signal part CLK_even and CLK_odd to the even-odd bit alignment unit BAL, and the latter transfers the balanced clock signal to the drift compensation FIFO. The drift compensation FIFO receives the double half rate reference clock signal CLK_ref (2 hr) at its reset terminal and this double half rate reference clock signal CLK_ref (2 hr) is also transferred to the FIR-filter FIR, to the serial-to-parallel converter S/P, the parallel-to-serial converter P/S, and from there to the write FIFO and to the read FIFO, respectively. The latter also receives the octal rate clock signal CLK (⅛) from the memory core for carrying out the clock domain conversion.

As it is described above and depicted in FIG. 3, the present embodiment of the high-speed interface circuit according to a first preferred embodiment comprises:

a serial output terminal connectable to a serial input terminal of an interface circuit of a next (adjacent downstream) memory chip or to a serial input terminal of the memory controller;

a serial input terminal for receiving a serial stream of data/command-and-address signals from a serial output terminal of a corresponding interface circuit section of a preceding (upstream) same memory chip or from a serial output terminal of a memory controller;

a read and write data/command-and-address signal re-driver-/transmitter path arranged for re-driving read data signals and write data/command-and-address signals not destined to the present semiconductor memory chip and received at the serial input terminal; and a main signal path leading from a parallel read data input terminal to the serial output terminal for transmitting read data from the memory core and from the serial input terminal to a parallel write data/command-and-address signal output terminal to transfer parallel write data/command-and-address signals to the memory core and including:

synchronization means for synchronizing with a reference clock signal data/command-and-address signals received at the serial input terminal;

serial-to-parallel converting means for serial-to-parallel converting write data/command-and-address signals destined to the present memory chip;

first clock domain conversion and signal buffering means for buffering and converting the clock domain of the synchronized and serial-to-parallel converted write data/command-and-address signals destined for the present memory chip to the clock domain of the memory core before delivering them to the parallel output terminal and from there to the memory core;

second clock domain conversion and signal buffering means for buffering the parallel read data signals received from the memory core at the parallel read data input terminal and converting the clock domain thereof from the clock domain of the memory core to the clock domain of the reference clock signal;

parallel-to-serial conversion means for parallel-to-serial converting the buffered and clock domain converted parallel read data signals into a serial read data signal stream; and first insertion means for inserting the parallel-to-serial converted read data signal stream into the serial data stream of the read and write data-/command and address signal re-driver/transmitter path and for transferring it to the serial output terminal, wherein the high-speed interface circuit further includes a reference clock receiving terminal for receiving the reference clock signal.

The read and write data/command and address signal re-driver-/transmitter path in its normal function is a synchronized signal re-driver/transmitter path which uses sections and circuit blocks of the main signal path for synchronizing the re-driven read and write data/command and address signals with the reference clock, namely the bit synchronization unit SYNC, the even-odd bit alignment unit BAL, the drift compensation FIFO, the mode switch MODES1, the FIR-filter FIR, the 2:1 serializer SER and the buffer circuit BUF3 of the sections 10A(re) to 10F(re). If only the synchronized signal re-driving/transmitting and synchronization path is present, the second mode switch MODES2 can be dropped.

The high-speed interface circuit I according to an optional version comprises the transparent signal re-driver/transmitter path 11tre and the second mode switch MODES2. The transparent signal re-driver/transmitter path 11tre allows an advantageous transparent signal transmission for example during test operation of the memory chip including the present high-speed interface circuit I. It is further to be noted that the embodiment depicted in FIG. 3 includes the separate write and read FIFOs each for implementing the first and second clock domain conversion and signal buffering means.

Figure 4:
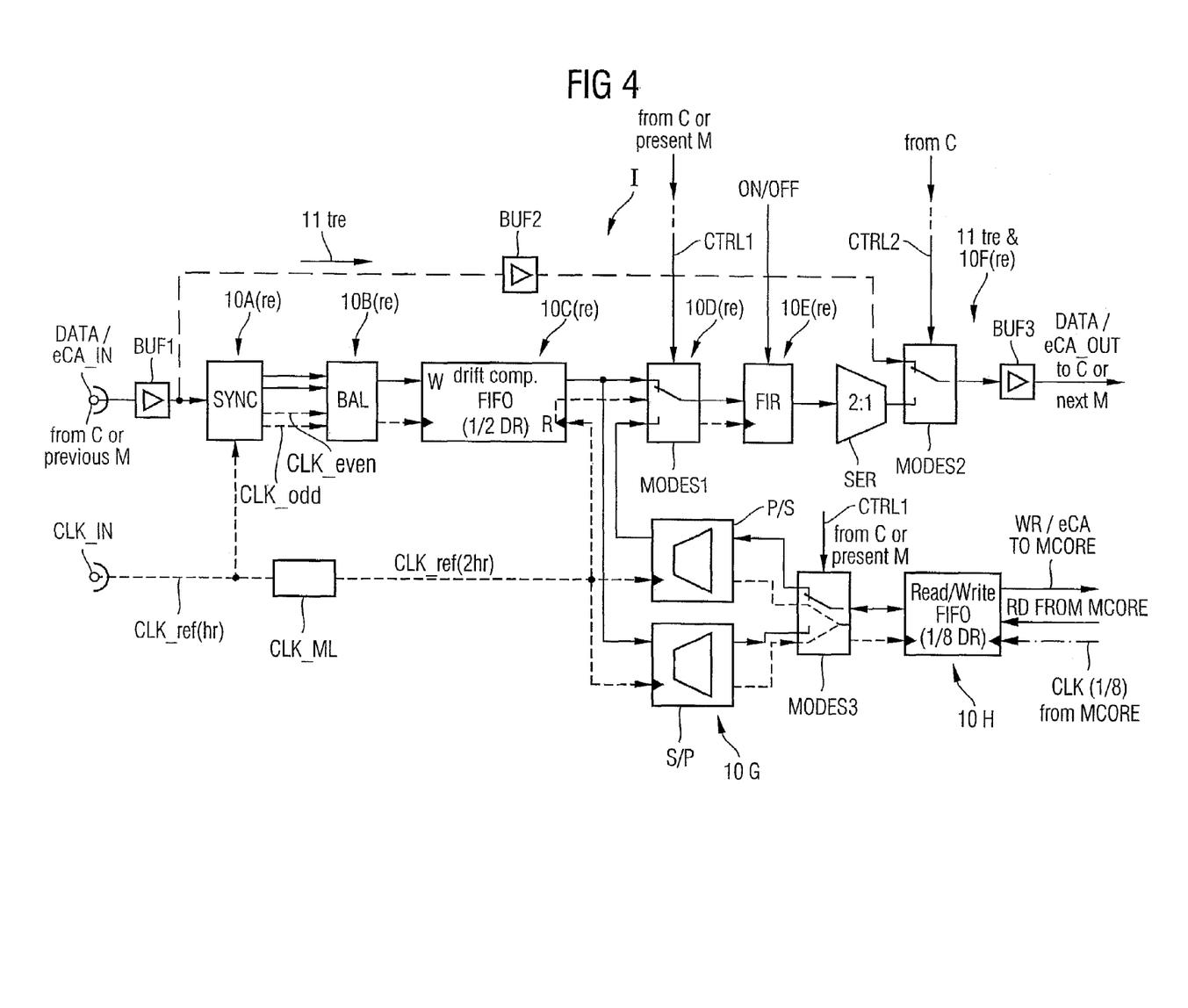
FIG. 4 schematically shows a functional block diagram of a second preferred embodiment of a high-speed interface circuit also including a transparent signal re-driving/transmitting path.

The second preferred embodiment depicted in FIG. 4 comprises alternatively in section 10H a shared read/write FIFO and a third mode switch MODES3 controlled by the control signal CTRL1 (rank signal). The third mode switch MODES3 is provided for switching between the parallel write data/command-and-address signals provided from the serial-to-parallel converter S/P to the shared read/write FIFO and the parallel read data signals provided by the shared read/write FIFO to the parallel-to-serial converter P/S and further is provided for switching the clock signals from the serial-to-parallel converter S/P and the parallel-to-serial converter P/S to be transmitted to the shared read/write FIFO.

All other functional features and circuit constructions of the embodiment depicted in FIG. 4 are identical with those of the embodiment depicted in FIG. 3 and described above.

Both embodiments of the preferred high-speed interface circuit I depicted in FIGS. 3 and 4 have following read/write high-speed macro features:

bit synchronization (SYNC);
even-odd bit alignment (BAL);
feed forward drift compensation (drift compensation FIFO);
data insertion (MODES1);
de-emphasis (FIR-filter), and
transparent re-drive (optional).

The reference clock signal CLK_ref (hr) received at the reference clock receiving terminal CLK_IN of the preferred embodiments described above and depicted in FIGS. 3 and 4 is a half rate reference clock signal, the clock rate of which is one half of the clock rate of a basic memory system clock (not shown). However it is to be noted that the clock rate of the reference clock signal may also be one third or one quarter of the clock rate of the memory system clock. Likewise, the clock rate of the reference clock signal can be equal to the clock rate of the memory system clock.

Preferably, the present high-speed interface circuit is applied for and integrated in the memory chips M1-M4 shown in FIGS. 1 and 2 which therefore include a memory core MCORE, the memory core interface MCOREINT and the present high-speed interface circuit I having the features discussed above. The memory core of this semiconductor memory chip may be a dynamic RAM memory core.

Further, a plurality of semiconductor memory chips, for example four memory chips M1-M4 as depicted in FIGS. 1 and 2 each including the present high-speed interface circuit can be included in a semiconductor memory system where the memory chips M1-M4 are arranged on a memory module MMOD in form of a chain having a shared loop forward architecture and connected by means of a shared read and write data/command-and-address bus and by a point-to-point connection to a memory controller. Thus, a semiconductor memory system in which the memory chips including the present high-speed interface circuit are arranged on the memory module and connected in form of a shared loop forward architecture has following advantageous characteristics:

the propagation time for read data, write data and command and address signals is matched by the structure;

the sum of the propagation times is constant for each rank;

read data RD of each rank inserts natively;

the system calibration is quite simple;

the memory controller does not localize any arbitrary placement of a memory chip on the line;

the high-speed interface circuits I of each memory chip operate in a fully synchronized fashion; and in the case of the transparent re-drive path of the high-speed interface circuit, the memory chips form a delay line which is fully transparent for the memory controller.

The present memory chips and the memory system according to the present invention are adapted to transmit and receive a serial stream of read and write data/command-and-address signals (optionally including the rank select signals) in form of signal frames in accordance with a predefined protocol thus being perfectly adapted to the high-speed signal transmission rates of future semiconductor memory generations.

Even if FIGS. 1 and 2 are showing four memory chips M1-M4 and their arrangement on the memory module MMOD, one skilled in the art will recognize that the number of the memory chips of the present invention arranged on the memory module may be different, that is, the semiconductor memory module may include an arbitrary number of memory chips each including the present high-speed interface circuit and chained in form of a shared loop forward architecture. Similarly, the present semiconductor memory system may include more than one memory module, wherein the shared loop forward architecture of a plurality of memory modules forms a ring structure.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

M, M1, M2, M3, M4 semiconductor memory chips
MMOD memory module
CLK clock signal
C memory controller
RD read data
RE re-drive
WR/eCA shared read and write data-/command and address bus
RS rank select signal
MCORE memory core
MCOREINT memory core interface
I high-speed interface circuit
DATA/eCA_IN serial read and write data-/command and address signal input terminal (from C or previous M)
BUF 1, 2, 3 first, second, third buffer circuit
CLK_IN reference clock input terminal
CLK_ref(hr) half rate reference clock signal
CLK_ML clock buffer-multiplier
CLK_ref(2 hr) double half rate reference clock signal
CLK_even, CLK_odd even, odd reference clock components
10A(re), 10B(re), 10C(re), 10D(re), 10E(re), 10F(re) common sections of main signal path and of synchronized signal re-driver/transmitter path
11tre transparent signal re-driver/transmitter path
SYNC bit synchronization unit
BAL even-odd bit alignment unit
MODES1, MODES2, MODES3 first to third mode switches
FIR finite impulse response filter
SER 2:1 serializer
P/S parallel-to-serial converter
S/P serial-to-parallel converter
10G, 10H further sections of the main signal path
CLK(⅛) octal rate clock from the memory core
write FIFO first clock domain conversion and signal buffering means
read FIFO second clock domain conversion and signal buffering means
read/write FIFO shared first and second clock domain conversion and signal buffering means
CTRL1, CTRL2 external control signals for the first to third mode switches
ON/OFF enable signal for FIR

What is claimed:

1. An interface circuit implemented in a semiconductor memory chip having a memory core, the interface circuit being connectable to a shared read and write data/command-and-address bus and comprising:
   a serial output terminal connectable to a serial input terminal of an interface circuit of another memory chip or to a serial input terminal of a memory controller;
   a serial input terminal for receiving a serial stream of data/command-and-address signals from a serial output terminal of an interface circuit of another memory chip or from a serial output terminal of a memory controller;
   a reference clock receiving terminal for receiving a reference clock signal;
   a read and write data/command-and-address signal re-driver/transmitter path for re-driving read data signals and write data/command-and-address signals not destined for the semiconductor memory chip and received at the serial input terminal; and
   a main signal path leading from a parallel read data input terminal to the serial output terminal for transmitting read data from the memory core and from the serial input terminal to a parallel write data/command-and-address signal output terminal to transfer parallel write data/command-and-address signals to the memory core and including:
      a synchronization unit for synchronizing data/command-and-address signals received at the serial input terminal with the reference clock signal;
      a serial-to-parallel converter for serial-to-parallel converting write data/command-and-address signals destined for said semiconductor memory chip;
      a first-in-first-out write data buffer register configured to buffer the synchronized and serial-to-parallel convened write data/command-and-address signals destined for the semiconductor memory chip and convert a clock domain of the write data/command-and-address signals to a clock domain of the memory core;
      a first-in-first-out read data buffer register configured to buffer the parallel read data signals received from the memory core and convert a clock domain of the parallel read data signals from the clock domain of the memory core to the clock domain of the reference clock signal;
      a parallel-to-serial converter for parallel-to-serial converting the buffered and clock domain converted parallel read data signals into a serial read data signal stream; and
      a first switching device configured to insert the parallel-to-serial converted read data signal stream into the serial data stream of the read and write data/command-and-address signal re-driver/transmitter path.

2. The interface circuit of claim 1, wherein the read and write data/command and address signal re-driver/transmitter path includes the synchronization unit of the main signal path, which synchronizes the re-driven read and write data/command-and-address signals with the reference clock signal.

3. The interface circuit of claim 1, wherein the read and write data/command-and-address signal re-driver/transmitter path includes a transparent signal re-driver/transmitter path without clock signal synchronizing circuitry.

4. The interface circuit of claim 3, further comprising a second switching device arranged upstream of the serial output terminal and controlled by an external signal from the memory controller for selectively switching between the signals re-driven through the transparent re-driver/transmitter path and the signals driven through the main signal path.

5. The interface circuit of claim 1, further comprising:
   an even/odd bit alignment unit serially connected downstream of the synchronization unit and arranged for buffering the serial data/command-and-address signals synchronized and sampled by the synchronization unit and aligning the sampled even and odd signals synchronously with the reference clock, wherein:
   the serial-to-parallel converter is connected downstream of the even/odd bit alignment unit and converts the synchronized write data/command-and-address signals buffered and aligned by the even/odd bit alignment unit into the parallel write data/command-and-address signals; and
   the first-in-first-out write data buffer register is connected downstream of the serial-to-parallel converter at the parallel output terminal and is configured to deliver a parallel write data stream to the memory core synchronously to an internal clock rate of the memory core and to compensate for different data skews and drifts.

6. The interface circuit of claim 5, wherein the main signal path further includes:
   a drift compensation first-in-first-out register unit serially connected downstream of the even/odd bit alignment unit and configured to compensate for phase drift of the even/odd bit aligned serial data/command-and-address signals in synchronism with the reference clock signal; and
   a 2:1-serializer serially arranged downstream of the first-in-first-out write data buffer register and the drift compensation first-in-first-out register unit.

7. The interface circuit of claim 6, wherein a data input of the serial-to-parallel converter is connected to an output of the drift compensation first-in-first-out register unit.

8. The interface circuit of claim 5, wherein the main signal path further includes:
   a drift compensation first-in-first-out register unit serially connected downstream of the even/odd bit alignment unit to compensate for phase drift of the even/odd bit aligned serial write data/command-and-address signals in synchronism with the reference clock signal;
   a de-emphasize FIR-unit serially connected downstream of the drift compensation first-in-first-out register unit and configured for channel adaptation to compensate for inter symbol interference; and
   a 2:1-serializer serially connected downstream of the first buffer means and the de-emphasize FIR-unit.

9. The interface circuit of claim 8, wherein the de-emphasize FIR-unit can be switched off by an external signal from the memory controller.

10. The interface circuit of claim 1, wherein:
   the first-in-first-out write data buffer register is connected to the parallel output terminal, for delivering a parallel write data stream to the memory core synchronized to an internal clock rate of the memory core and compensating for different data skews and drifts;
   the first-in-first-out read data buffer register is connected to the parallel input terminal; and
   write data write-in and read-out operations in/from the first-in-first-out write data buffer register are synchronized by the reference clock signal and the clock signal of the memory core, respectively, and read data write-in and read-out operations in/from the first-in-first-out read data buffer register are synchronized by the clock signal of the memory core and by the reference clock, respectively.

11. The interface circuit of claim 1, wherein the first-in-first-out write data and read data buffer registers share a common first-in-first-out buffer register unit arranged at the parallel read data input terminal and the parallel write data-/command and address signal output terminal from/to the memory core, wherein write data write-in and read-out operations in/from the common first-in-first-out buffer register unit are synchronized by the reference clock signal and the clock signal of the memory core, respectively, and read data write-in and read-out operations in/from the common first-in-first-out buffer register unit are synchronized by the clock signal of the memory core and by the reference clock, respectively, wherein the interface circuit further comprises:
   a mode switch coupled to the common first-in-first-out buffer register unit for switching over the serial-to-parallel convened write data/command-and-address signals from the serial-to-parallel converter and the reference clock signal therefrom for the write-in operation into the common first-in-first-out buffer register unit and the read data signals read-out by a read operation from the common first-in-first-out buffer register unit in synchronism with the reference clock to the parallel-to-serial converter.

12. The interface circuit of claim 11, wherein the switching operation of the mode switch is controlled by an external switching control signal supplied from the memory controller.

13. The interface circuit of claim 11, wherein switching over of the mode switch is controlled by an internal control signal of the semiconductor memory chip.

14. The interface circuit of claim 1, wherein the first switching device comprises a mode switch arranged for switching over between a parallel-to-serial converted read data signal stream and a data stream of the read and write data/command-and-address signal re-driver/transmitter path, the mode switch being controlled by an external switching control signal supplied from the memory controller.

15. The interface circuit of claim 1, wherein the first switching device comprises a mode switch arranged for switching over between a parallel-to-serial converted read data signal stream and a data stream of the read and write data/command-and-address signal re-driver/transmitter path, the mode switch being controlled by an internal switching control signal of the semiconductor memory chip.

16. A memory chip comprising a memory core and an interface circuit, the interface circuit comprising:
   a serial output terminal connectable to a serial input terminal of an interface circuit of another memory chip or to a serial input terminal of a memory controller;
   a serial input terminal for receiving a serial stream of data/command-and-address signals from a serial output terminal of an interface circuit of another memory chip or from a serial output terminal of the memory controller;
   a reference clock receiving terminal for receiving a reference clock signal;
   a read and write data/command-and-address signal re-driver/transmitter path for re-driving read data signals and write data/command-and-address signals not destined for the semiconductor memory chip and received at the serial input terminal; and
   a main signal path leading from a parallel read data input terminal to the serial output terminal for transmitting read data from the memory core and from the serial input terminal to a parallel write data/command-and-address signal output terminal to transfer parallel write data/command-and-address signals to the memory core and including:
      a synchronization unit for synchronizing data/command-and-address signals received at the serial input terminal with the reference clock signal;
      a serial-to-parallel converter for serial-to-parallel converting write data/command-and-address signals destined for said semiconductor memory chip;
      a first-in-first-out write data buffer register configured to buffer the synchronized and serial-to-parallel convened write data/command-and-address signals destined for the semiconductor memory chip and convert and clock domain of the write data/command-and-address signal to a clock domain of the memory core;
      a first-in-first-out read data buffer register configured to buffer the parallel read data signals received from the memory core and convert a clock domain of the parallel read data signals from the clock domain of the memory core to the clock domain of the reference clock signal;

a parallel-to-serial converter for parallel-to-serial converting the buffered and clock domain converted parallel read data signals into a serial read data signal stream; and a first switching device configured to insert the parallel-to-serial converted read data signal stream into the serial data stream of the read and write data/command-and-address signal re-driver/transmitter path.

17. The memory chip of claim 16, wherein the read and write data/command and address signal re-driver/transmitter path includes the synchronization unit of the main signal path, which synchronizes the re-driven read and write data/command-and-address signals with the reference clock signal.

18. The memory chip of claim 16, wherein the read and write data/command-and-address signal re-driver/transmitter path includes a transparent signal re-driver/transmitter path without clock signal synchronizing circuitry.

19. The memory chip of claim 18, wherein the interface circuit further comprises a second switching device arranged upstream of the serial output terminal and controlled by an external signal from the memory controller for selectively switching between the signals re-driven through the transparent re-driver/transmitter path and the signals driven through the main signal path.

20. The memory chip of claim 16, wherein:
the interface circuit further comprises an even/odd bit alignment unit serially connected downstream of the synchronization unit and arranged for buffering the serial data/command-and-address signals synchronized and sampled by the synchronization unit and aligning the sampled even and odd signals synchronously with the reference clock;
the serial-to-parallel converter is connected downstream of the even/odd bit alignment unit and converts the synchronized write data/command-and-address signals buffered and aligned by the even/odd bit alignment unit into the parallel write data/command-and-address signals; and
the first-in-first-out write data buffer register is connected downstream of the serial-to-parallel converter at the parallel output terminal and is configured to deliver a parallel write data stream to the memory core synchronously to an internal clock rate of the memory core and to compensate for different data skews and drifts.

21. The memory chip of claim 20, wherein the main signal path further includes:
a drift compensation first-in-first-out register unit serially connected downstream of the even/odd bit alignment unit and configured to compensate for phase drift of the even/odd bit aligned serial data/command-and-address signals in synchronism with the reference clock signal; and
a 2:1-serializer serially arranged downstream of the first buffer and the drift compensation first-in-first-out register unit.

22. The memory chip of claim 20, wherein the main signal path further includes:
a drift compensation first-in-first-out register unit serially connected downstream of the even/odd bit alignment unit to compensate for phase drift of the even/odd bit aligned serial write data/command-and-address signals in synchronism with the reference clock signal;
a de-emphasize FIR-unit serially connected downstream of the drift compensation first-in-first-out register unit and configured for channel adaptation to compensate for inter symbol interference; and
a 2:1-serializer serially connected downstream of the first buffer means and the de-emphasize FIR-unit.

23. The memory chip of claim 16, wherein:
the first-in-first-out write data buffer register is connected to the parallel output terminal, for delivering a parallel write data stream to the memory core synchronized to an internal clock rate of the memory core and compensating for different data skews and drifts;
the first-in-first-out read data buffer register is connected to the parallel input terminal; and
write data write-in and read-out operations in/from the first-in-first-out write data buffer register are synchronized by the reference clock signal and the clock signal of the memory core, respectively, and read data write-in and read-out operations in/from the first-in-first-out read data buffer register are synchronized by the clock signal of the memory core and by the reference clock, respectively.

24. The memory chip of claim 16, wherein the first-in-first-out write data and read data buffer registers share a common first-in-first-out buffer register unit arranged at the parallel read data input terminal and the parallel write data-/command and address signal output terminal from/to the memory core, wherein write data write-in and read-out operations in/from the common first-in-first-out buffer register unit are synchronized by the reference clock signal and the clock signal of the memory core, respectively, and read data write-in/and read-out operations in/from the common first-in-first-out buffer register unit are synchronized by the clock signal of the memory core and by the reference clock, respectively, wherein the interface circuit further comprises:
a mode switch coupled to the common first-in-first-out buffer register unit for switching over the serial-to-parallel convened write data/command-and-address signals from the serial-to-parallel converter and the reference clock signal therefrom for the write-in operation into the common first-in-first-out buffer register unit and the read data signals read-out by a read operation from the common first-in-first-out buffer register unit in synchronism with the reference clock to the parallel-to-serial converter.

25. The memory chip of claim 16, wherein the first switching device comprises a mode switch arranged for switching over between a parallel-to-serial converted read data signal stream and a data stream of the read and write data/command-and-address signal re-driver/transmitter path, the mode switch being controlled by an external switching control signal supplied from the memory controller.

26. The memory chip of claim 16, wherein the first switching device comprises a mode switch arranged for switching over between a parallel-to-serial converted read data signal stream and a data stream of the read and write data/command-and-address signal re-driver/transmitter path, the mode switch being controlled by an internal switching control signal of the semiconductor memory chip.

27. A memory system including a plurality of semiconductor memory chips according to claim 16 arranged on a memory module in a chain and connected in a shared loop forward manner by a shared read and write data/command-and-address bus and by a point-to-point connection to a memory controller.

* * * * *

UNITED STATES PATENT AND TRADEMARK OFFICE
CERTIFICATE OF CORRECTION

PATENT NO. : 7,475,187 B2  Page 1 of 1
APPLICATION NO. : 11/226457
DATED : January 6, 2009
INVENTOR(S) : Peter Gregorius et al.

It is certified that error appears in the above-identified patent and that said Letters Patent is hereby corrected as shown below:

Column 12, lines 15 & 16: replace "serial-to-parallel convened" with -- serial-to-parallel converted --;

Column 13, line 63: replace "convened write data/command" to -- converted write data/command --;

Column 14, lines 57 & 58: replace "serial-to-parallel convened" with -- serial-to-parallel converted --; and Column 16, line 36: replace "convented write data/command" with -- converted write data/command --.

Signed and Sealed this

Third Day of March, 2009

JOHN DOLL
*Acting Director of the United States Patent and Trademark Office*